United States Patent [19]

Sillner

[11] Patent Number: 4,738,348
[45] Date of Patent: Apr. 19, 1988

[54] TURNING DEVICE

[76] Inventor: Georg Sillner, Buchenstrasse 23, 8411 Zeitlarn, Fed. Rep. of Germany

[21] Appl. No.: 834,796

[22] Filed: Feb. 28, 1986

[30] Foreign Application Priority Data

Mar. 2, 1985 [DE] Fed. Rep. of Germany ... 8506071[U]

[51] Int. Cl.$^4$ .................. B65G 47/24; B07C 5/344
[52] U.S. Cl. .................... 198/376; 74/527;
198/377; 198/399; 209/573; 403/DIG. 1;
414/225
[58] Field of Search ............ 74/527; 198/376, 377,
198/378, 394, 399, 395, 472.1, 474.1, 476.1;
209/573; 403/DIG. 1; 414/222, 225

[56] References Cited

U.S. PATENT DOCUMENTS

| | | | |
|---|---|---|---|
| 2,643,778 | 6/1953 | Socke | 198/377 |
| 3,319,764 | 5/1967 | Gamberini | 198/377 |
| 3,810,540 | 5/1974 | Georges | 209/573 X |
| 3,941,242 | 3/1976 | Braden | 198/472.1 |
| 4,261,680 | 4/1981 | Carnley et al. | 198/399 X |
| 4,520,931 | 6/1985 | Evain | 198/399 X |
| 4,582,201 | 4/1986 | Taniguchi et al. | 198/377 X |
| 4,609,325 | 9/1986 | Gabrielli | 403/DIG. 1 X |

FOREIGN PATENT DOCUMENTS

2437726  5/1980  France .......... 403/DIG. 1

Primary Examiner—Frank E. Werner
Assistant Examiner—Janice Krizek
Attorney, Agent, or Firm—Lucas & Just

[57] ABSTRACT

A turning device for electrical axial components which utilizes a transport element (8) that is mounted on a machine support (9) to rotate about a shaft (10). Mounted on the transport element (8) are a plurality of receivers (11, 11') for holding the electrical axial component (2). Each receivers (11, 11') is rotatable about a shaft (14, 14'). Each receivers (11, 11') has a pair of magnets (17, 17') arranged about shaft (14, 14'). The transport element (8) has a magnet arrangement therein which is also oriented about the shaft (14, 14'). Machine support (9) has a rolling surface (24) for rotating receivers (11, 11') about shaft (14, 14'), rolling surface 24 being movable between a rest position and an operating position.

15 Claims, 5 Drawing Sheets

TURNING DEVICE

In the machine processing of electrical axial components, such as in particular diodes, it is frequently necessary to give these components the same spatial orientation with respect to their electrical properties (polarity), i.e. to orientate them in such a way that all the components conveyed on a conveying length for further processing have in each case the same position with respect to their electrical polarity.

The object of the invention is to provide a turning device which makes it possible, with little structural outlay, to give axial components of this type, which are presented to a conveying device in random orientation, the same orientation required for the further processing, in such a way that the incorrectly orientated components are turned through 180° about an axis perpendicular to the axis of the leads.

In order to attain this object a turning device is characterized by a transporting element, which is mounted on a machine support so as to be rotatable about a first rotation shaft and supports, at equal intervals from the first rotation shaft in each case, a plurality of receiving means, each of which is mounted on the transporting element so as to be freely rotatable about a second rotation shaft and comprises an annular surface extending concentrically to the second rotation shaft, each receiving means forming a receiving surface with holding means for holding a component and with one surface which is adjacent a surface of the transporting element; by a first magnet arrangement on each receiving means; by a second magnet arrangement on the transporting element for each receiving means, one of the two magnet arrangements forming—on the mutually adjacent surfaces—at least one magnetic pole of a first polarity offset radially with respect to the second rotation shaft and disposed at a distance from the said rotation shaft and the other magnet arrangement forming—on the mutually adjacent surfaces and at approximately the same distance from the second rotation shaft—two magnetic poles offset by 180° about the second rotation shaft and having the second polarity which is different from the first one; by a rolling surface provided on the machine support for the annular surfaces of the receiving means; and the rolling surface being movable from a rest position, in which the rolling surface lies at a distance from an annular surface moving past, to an operative position, in which the rolling surface bears against an annular surface moving past.

The turning device according to the invention is preferably used in conjunction with a conveying device by which the components are conveyed to the turning device and by which the components are passed on from the turning device for the further processing. The components are removed from the transporting device individually and in succession by one receiving means in each case, namely by virtue of the fact that the components either remain sticking by their leads consisting of ferromagnetic material to magnetic poles provided on the receiving surfaces of the receiving means, or, on the other hand, stick to the receiving means on account of underpressure or a suction action. The receiving means provided on the transporting element are then moved together with the components held thereon past a testing station in which the polarity and orientation of the components are examined. If a component provided on a receiving means does not happen to have the correct orientation, the respective receiving means and thus also the component held on the said receiving means are turned through 180° about the second rotation shaft, namely in such a way that the movable rolling surface provided on the machine support is moved from a rest position into an operative position in such a way that the annular surface of the receiving means holding the incorrectly orientated component rolls over the rolling surface. Mechanical criteria or criteria based upon the shape of the components (for example component bodies) can of course also be used for actuating the rolling surface.

The surfaces lying adjacent to one another on the receiving means and magnetic poles provided on the transporting element ensure, despite the freely rotatable mounting of the receiving means on the transporting element, that the said receiving means can have only two stable rotational positions in each case, not only ensuring a trouble-free removal of the components from the transporting device and a trouble-free transfer of the components to the transporting device, but also making possible a precise turning of the incorrectly orientated components by simply rolling the annular surface provided on the receiving means over the rolling surface, since the receiving means comprise only two stable rotational positions in each case.

In the case of a particularly advantageous embodiment the first magnet arrangement, or the magnets (preferably permanent magnets) forming this magnet arrangement respectively, is or are used at the same time for holding the components on the receiving means.

"Axial components" are those which are provided at both ends with leads projecting from a component body.

Further developments of the invention constitute the subject of the Sub-Claims.

The invention is explained in greater detail below with reference to the FIGURES which illustrate embodiments of the turning device according to the invention in diagrammatic views. In the drawings

In the apparatus of FIGS. 1 to 6 electrical axial components 2 with leads 3 of ferromagnetic material (for example diodes) are supplied to the turning device 4 and are removed from the turning device in the direction of the arrow A with the aid of a conveying device 1. The conveying device 1 essentially comprises two continuous belt-shaped conveying elements 5 which, in the part of the conveying device 1 effective for conveying the components 2, form two lengths which extend in the horizontal direction and are arranged parallel to one another and at a distance from one another. Each conveying element 5 is provided with a plurality of projections 6 which extend beyond the top of the lengths of the conveying elements 5 forming the operative part of the conveying device 1, so that a compartment 6' or a receiving means open towards the top is formed in each case between two mutually adjacent projections 6 on each conveying element 5. Each component 2 lies with its body between the two conveying elements 5 and is held by its leads 3 in each case in a compartment 6' of the two conveying elements 5 and is thus brough forward to the turning device 4 or removed again therefrom at right angles to the longitudinal extension of the leads 3 by the conveying device 1. By means (not shown in greater detail), for example by lateral, stationary guide rails or guide strips, against which the ends of the leads 3 extending in the horizontal direction bear, it is forcibly ensured that the components 2 held in the conveying device 1 are not displaced in the direction of their leads 3.

Figure 1:
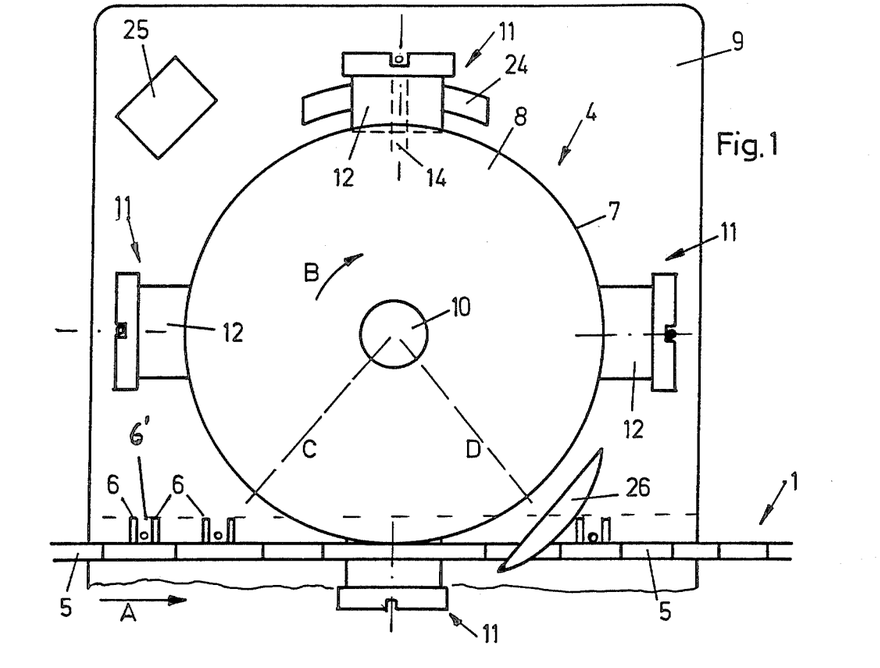
FIG. 1 is a side view of a turning device, together with a conveying device.
Figure 2:
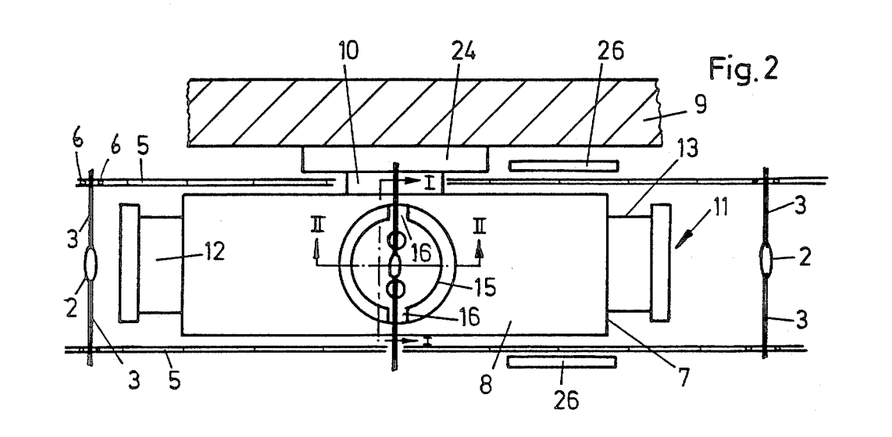
FIG. 2 is a plan view of the device according to FIG. 1.

The turning device 4 essentially comprises a transporting element 8, which in the embodiment illustrated is formed by a disc with a circular peripheral surface 7 and which is mounted on a plate slab 9 of the machine support above the conveying device 1 so as to be rotatable about a horizontal shaft 10 extending at right angles to the conveying direction (arrow A) of the conveying device 1 and is driven in a rotating manner by drive means (not shown in greater detail) in the direction of the arrow B.

In the embodiment illustrated, four receiving means 11 are arranged each offset by 90° with respect to one another about the shaft 10 on the peripheral surface 7 of the transporting element 8. Each of the similarly designed receiving means 11 essentially comprises a cylinder member 12 with a circular-cylindrical peripheral surface 13 which lies with the axis of its cylinder radially to the shaft 10 and is held on the peripheral surface 7 with the aid of a pivot pin 14 so as to be freely rotatable about the said cylinder axis extending radially to the shaft 10. On its end face which is disposed at a distance from the transporting element 8, on which the cylinder member 12 has an increased cross-section, the cylinder member is provided with an annular edge 15 projecting beyond the said end face or is made approximately cup-shaped, the edge 15 being interrupted on two areas 16 offset by 180° with respect to one another about the pivot pin 14.

Figures 3, 4, 5, 6:
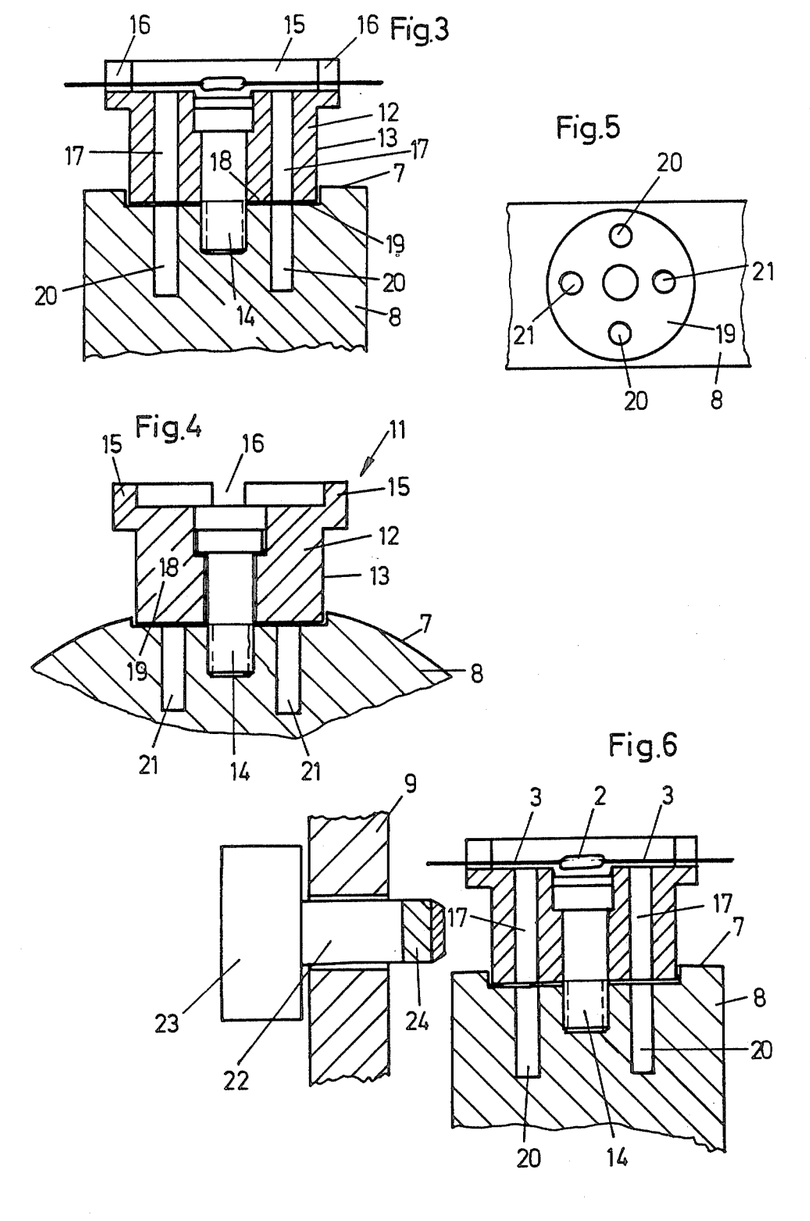
FIG. 3 is a partial section corresponding to the line I—I in FIG. 2.
FIG. 4 is a partial section corresponding to the line II—II in FIG. 2.
FIG. 5 is a partial plan view of the part of the transporting element of the device in FIG. 1 used for holding a receiving means, but with the receiving means removed.
FIG. 6 is a section through a plate slab of the machine support of the device according to FIG. 1, together with a partial view of the transporting element rotatably mounted on the said plate slab and together with the reciprocatable rolling surface provided on the plate slab for the annular surfaces of the receiving means.

In the embodiment illustrated, two bar-shaped permanent magnets 17, which reach with one end as far as the end face of the cylinder member 12 remote from the transporting element 8 and which in the embodiment illustrated have their north pole there, are disposed in each cylinder member 12. The two permanent magnets 17, which with their longitudinal extension are parallel to the axis of the pivot pin 14, are likewise arranged offset by 180° with respect to one another about the pivot pin 14, each at the same distance from the said pivot pin, and in addition the north pole of the permanent magnets 17 lie on a common line with the recesses 16.

With their other end which forms the south pole, the permanent magnets 17 reach as far as the end face 18 of the cylinder member 12, which end face faces the transporting element 8 and which is directly opposite a flat surface 19 formed on the peripheral surface 7 of the transporting element 8.

In the embodiment illustrated, four permanent magnets 20 and 21 are provided on the surface 19 each offset by 90° with respect to one another about the pivot pin 14 and form magnetic poles on the surface 19. The permanent magnets 20 offset by 180° with respect to one another or their poles are arranged on a line which extends parallel to the shaft 10 and which also intersects the axis of the pivot pin 14, while the two permanent magnets 21 or their poles are arranged on the surface 19 on both sides of the pivot pin 14 on a line which likewise intersects the axis of the pivot pin 14 but which extends at right angles to the connexion line of the permanent magnets 20. Each permanent magnet 21 or its pole on the surface 19 is thus offset by 90° with respect to a permanent magnet 20 or its pole on the surface 19. The poles of the permanent magnets 20 and 21 formed on the surface 19 are at the same distance from the pivot pin 14 as the permanent magnets 17 on the associated receiving means or on the associated cylinder member 12.

The permanent magnets 20 have their poles orientated in such a way that they have their north pole on the surface 19 in each case. The permanent magnets 21 have their poles orientated in such a way that they have their south pole on the surface 19 in each case.

The permanent magnets 17 are used first of all for holding the component 2 received by a receiving means 11 on the leads 3, the component body being interposed between the two permanent magnets 17 or their poles in a recess which is provided in the end face of the cylinder member 12 remote from the transporting element 8. The permanent magnets 17 in conjunction with the permanent magnets 20 and 21 also ensure, however, that each receiving means 11 has only two stable rotational positions in which the connexion line extends between the recesses 16 parallel to the shaft 10. In these stable rotational positions, each receiving means 11 is held by the permanent magnet 17 cooperating with the permanent magnets 20. In intermediate positions, for example in an intermediate position in which the connexion line extends between the recesses 16 at right angles to the shaft 10, the permanent magnets 17 cooperating mainly with the permanent magnets 21 exert a torque upon the respective receiving means 11 in the sense of a rotation about the pivot pins 14, which torque and also the action between the permanent magnets 17 and 20 turns the receiving means 11 into one of the two stable positions.

A slide-like element 22 is guided in a reciprocating manner in the plate slab 9 in the direction of the shaft 10. A control element 23, which is formed for example by an electro-magnetic coil or by another actuating element, is used for moving the said element 22. The element 22 comprises a bearing surface 24, which is provided with a friction coating and against which the peripheral surfaces 13 of the receiving means 11 come to bear when the element 22 is advanced towards the transporting element 8 or towards the receiving means 11. In the embodiment illustrated the bearing surface 24 is situated above the shaft 10.

A further testing station 25, which comprises electrical contacts (not shown in greater detail) which cooperate with the leads 3 of the components 2 held on the receiving means 11, is provided on the plate slab 9 in the direction of movement of the transporting element 8 (arrow B) in front of the bearing surface 24.

The mode of operation of the turning device 4 may be described as follows:

When a receiving means 11 has reached the position designated C in FIG. 1, a component 2 is disposed on the conveying device 1 with its leads in the immediate vicinity of the permanent magnets 17 of this receiving means, so that the component 2 remains sticking with its leads 3 to the permanent magnets 17 of the respective receiving means 11 and as the transporting element 8 is turned in the direction of the arrow B the said component is moved jointly with the said receiving means 11. As soon as the component 2 sticking to the receiving means 11 has reached the testing station 25, the polarity of the diode forming the component 2 is examined by the said testing station 25. If the component 2 is in the correct position with respect to polarity, the component 2 is moved past the bearing surface 24 by the transporting element 8 without turning the receiving means 11 supporting the said component about the pivot pin 14, and finally, when the respective receiving means 11 has occupied the position indicated with the line D in FIG. 1, it is transferred back to the transporting device 1. In the embodiment illustrated, the component 2 is removed from the receiving means 11 at position D by two stationary curved strike-off members 26 cooperating with the leads 3. Other steps for removing the components 2 from the receiving means 11 and for transferring the components to the conveying device 1 are also, of course, possible.

If the testing station 25 detects an orientation of a component 2 which deviates from the specified polarity, the control device 23 is actuated so as to move out the slide-like element 22, as a result of which the bearing surface 24 comes to bear against the peripheral surface 13 of the respective receiving means 11. By rolling the peripheral surface 13 over the bearing surface 24 the respective receiving means 11 is turned through approximately 180° about the pivot pin 14, the action between the permanent magnets 17, 20 and 21 ensuring that the respective receiving means 11 at all events occupies a position turned through 180° about the axis of the pivot pin 14 with respect to the original position after moving past the bearing surface 24. After a receiving means 11 has been turned, the slide-like element 22 is of course moved back again into its starting position in which the bearing surface 24 is at a distance from the peripheral surfaces 13 of the receiving means 11.

All the components 2 at the position D transferred back to the conveying device 1 have the same orientation therefore with respect to their electrical polarity.

It is to be understood that the length of the bearing surface 24 is approximately equal to half the periphery of the receiving means 11 at their peripheral surface 13.

The transporting element 8 can be driven in a clock-timed manner or continuously in the direction of the arrow B. The conveying elements 5 can be driven in a clock-timed manner or continuously, but they must be driven synchronously with the drive of the transporting element 8 in such a way that when a receiving means 11 has reached the position C a component 2 is always ready on the conveying device 1 at this position, and when a receiving means 11 with a component 2 has reached the position D a compartment 6' formed by two projections 6 is always ready in each case on each conveying element 5 for receiving a lead 3.

Figure 7:
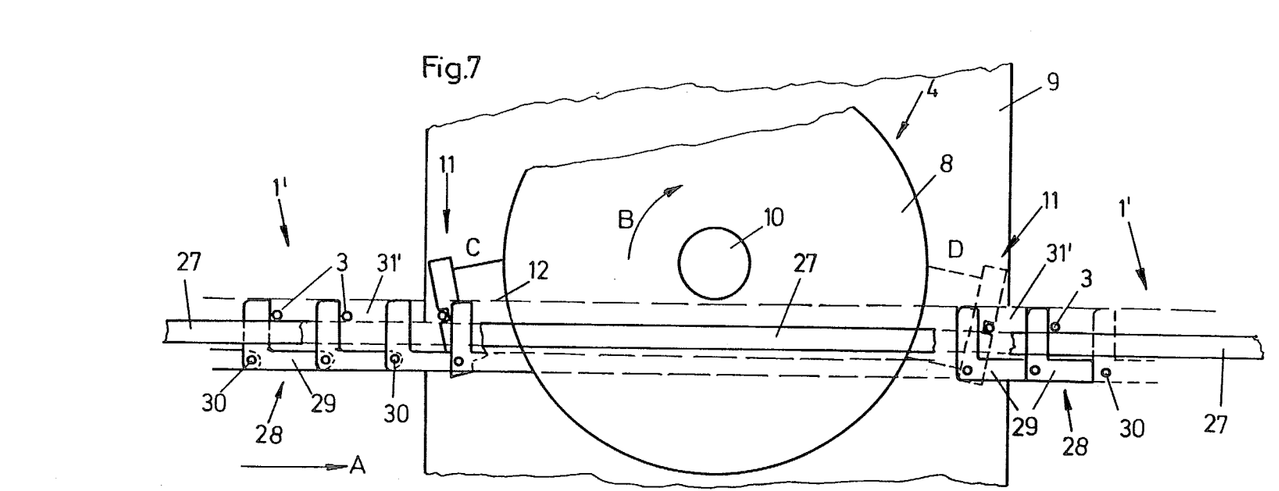
FIG. 7 is a simplified side view of the device according to FIG. 1 together with a further, particularly advantageous conveying device for bringing forward and removing the axial components.
Figure 8:
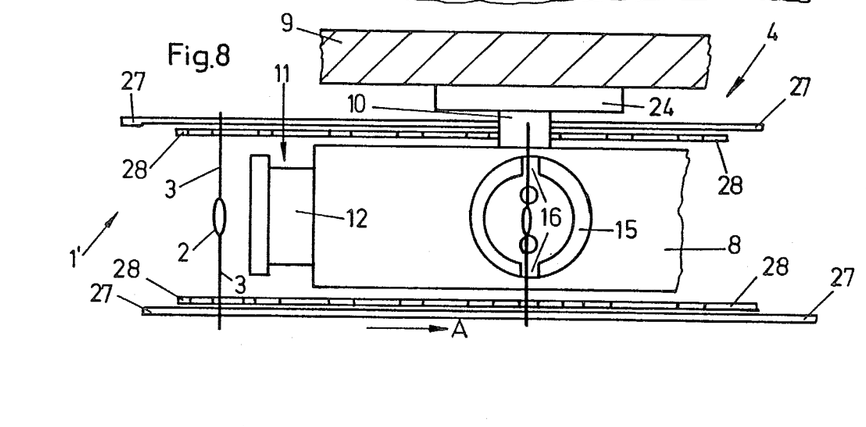
FIG. 8 is a partial plan view of the apparatus according to FIG. 7.

FIGS. 7 and 8 show an apparatus in which the turning device 4 is used together with a conveying device 1'.

The conveying device 1', which brings the components 2 back to the transporting element 8 in a horizontal direction in accordance with the arrow A and removes it from this transporting element, comprises two slide rails 27, which are disposed at a distance from one another and extend parallel to one another and which in each case form at their top a horizontal bearing or sliding surface for the leads 3 of the components 2. The conveying device 1' further comprises two chain-like continuous conveying elements 28, each of which is provided in the immediate vicinity of one of the mutually facing longitudinal sides of the slide rails 27. As in the case of the embodiment according to FIGS. 1 to 6, the transporting element 8 in the case of the embodiment according to FIGS. 7 and 8 also lies with a partial area inside the conveying device 1', i.e. between the slide rails 27 or the conveying elements 28 respectively.

The individual chain links 29 of the conveying elements 28 are made L-shaped from flat material (for example flat iron) and are connected to one another at their lower, horizontally extending arms by pivot pins 30 to form the chain-like conveying element 28. The top of the horizontal arms of the chain links 29 is at a lower level than the top of the slide rails 27, so that the leads 3 of the components 2 rest exclusively on the top of the slide rails 27. The vertical arms of the chain links 29 project above the top of the slide rails 27, so that the leads 3 of the components 2 are moved by these vertical arms in the direction of the arrow A. As shown for example in FIG. 7, compartments 31', which have a considerable width in the conveying direction A as compared to the diameter of the leads, are formed on each conveying element between two successive vertical arms of the chain links 29 in each case. When a component 2 reaches the position C, this component is attracted by the permanent magnets 17 of the available receiving means 11 and is thereby additionally accelerated, so that the said component 2 held with its leads 3 on the receiving means 11 by the permanent magnet 17 is then at an adequate distance from the immediately following vertical arms of the two conveying elements 28 and the leads 3 can be moved upwards out of the compartment 31' by the transporting element 8 circulating in the direction of the arrow B, before the immediately following vertical arms of the conveying elements 28 move past the path of movement of the receiving means 11. As shown on the right of FIG. 7, the transfer of the components 2 from each receiving means 11 to the conveying device 1', takes place at the position D on account of the fact that the leads 3 are inserted from above into an available compartment 31' of the conveying elements 28 in each case and are removed from the respective receiving means 11 by the vertical arms of the chain links 29 of the conveying elements 28. The two curved strike-off members 26 are not necessary in this embodiment. Although the conveying device 1' is again disposed below the horizontal shaft 10 extending at right angles to the conveying direction A, it is closer to the said shaft than the conveying device 1.

Figure 9:
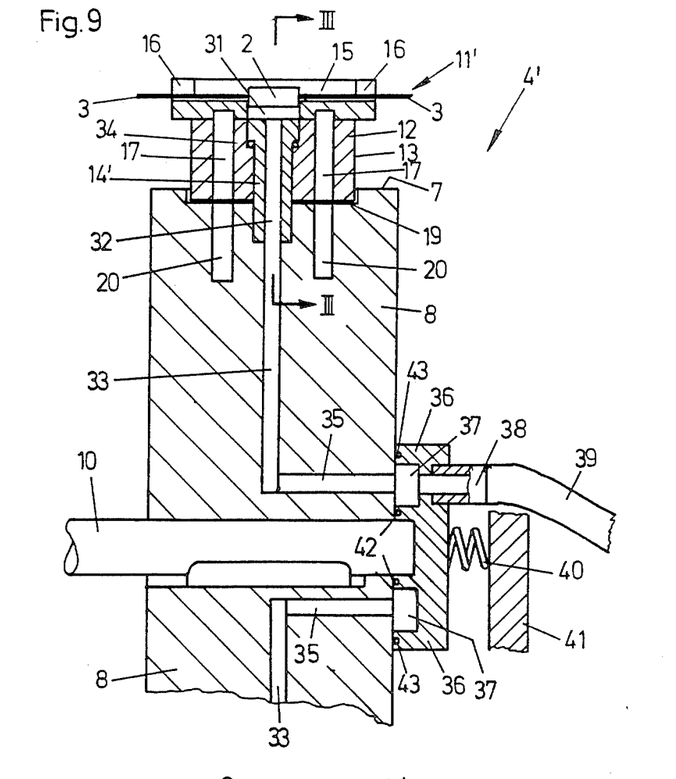
FIG. 9 is a cross-section through the transporting element comprising the receiving means in a further embodiment of the turning device, which is also suitable for processing axial components with leads of non-ferromagnetic material.
Figure 10:
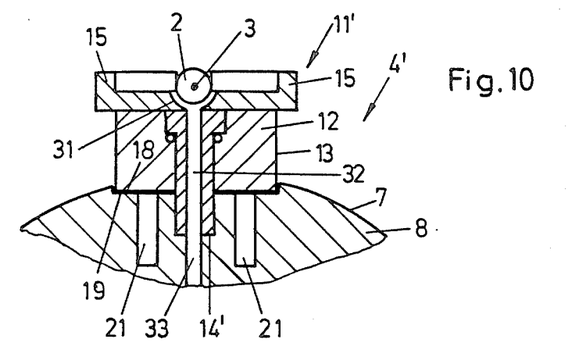
FIG. 10 is a section corresponding to the line III—III in FIG. 9.
Figure 11:
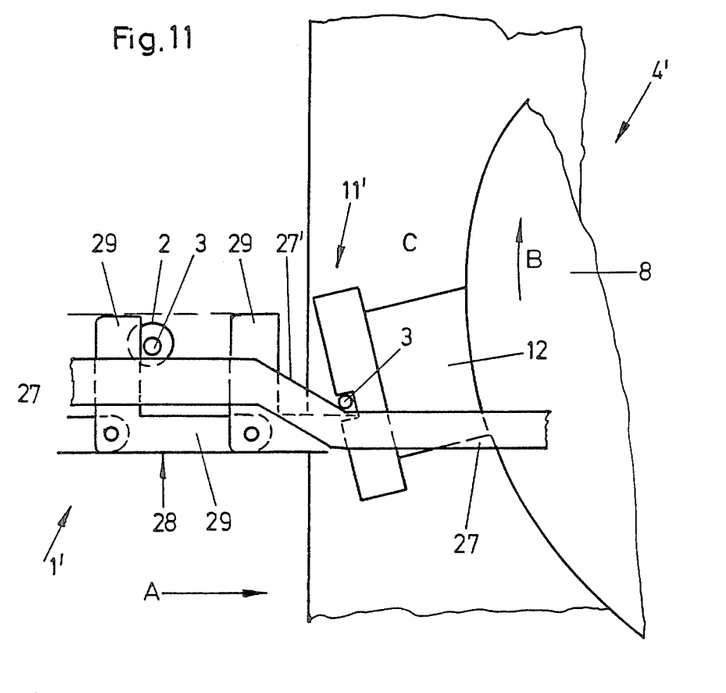
FIG. 11 is a simplified and enlarged view of the transfer of the components to the receiving means of the turning device according to FIG. 9.

While the turning device 4 illustrated in FIGS. 1 to 8 is suitable exclusively for the processing of components 2 with leads 3 of ferromagnetic material, FIGS. 9 to 11 illustrate a turning device 4' which is also suitable for components 2 with leads 3 of non-ferromagnetic material. Those elements which correspond in their design and operation to the elements of the turning device 4 have been given the same reference numerals in FIGS. 9 to 11.

The components 2 are held by underpressure on the receiving means 11' or the turning device 4'. To this end the receiving means 11' formed by the cylinder member 12 are provided on their end face situated at a distance from the transporting element 8 with a recess 31, the shape of which is adapted to the shape of the components 2 or their bodies, i.e. in the case of components with cylindrical bodies these recesses are formed as grooves closed at both ends and having a semicircular cross-section. Each receiving means 11' comprises a duct 32 which extends concentrically to the axis of the cylinder member 12 and radially to the shaft 10 and which opens at one end into the recess 31 and at the other end into a duct 33 extending radially to the shaft 10 in the transporting element 8. To this end, each receiving means 11' is provided with a pivot pin 14' which is provided with an internal bore and which with a partial length forms the duct 32 and with a partial length also forms part of the duct 33. A sealed transition between the ducts 32 and 33 is effected by at least one sealing ring 34, it being possible for the receiving means 11' to turn about the axis of the pivot pin 14'. Each duct 33 passes at its radially innermost end into a duct 35 which opens on one end face of the transporting element 8. A disc-shaped plate 36, which does not jointly rotate with the transporting element 8, i.e. is mounted stationarily bears with one lateral surface against this end face. On this lateral surface the plate 36 comprises an annular duct 37 which extends concentrically to the shaft 10 and which is connected by way of a connexion member 38 and a connexion hose 39 to a vacuum or underpressure source (not shown in greater detail). The plate 36 is pressed against the transporting element 8 by a spring element 40 (for example a compression spring) which is supported at one end on the plate 36 and at the other end on a stop 41 rigid with the machine. Two sealing rings 42 and 43 disposed concentrically to one another and concentrically to the shaft 10 are used for sealing purposes. The recesses 31 of all the receiving means 11' are connected to the underpressure source by way of the duct 37 and the ducts 32, 33 and 35, so that as the components 2 move from position C to position D of the transporting element 8 they are held with their bodies in the recesses 31 by underpressure.

The apparatus according to FIGS. 9 to 11 uses the conveying device 1'. Since the above-mentioned additional acceleration of the components 2 at position C cannot be effected by the permanent magnets 17, however, in the vicinity of position C (corresponding to FIG. 11) the tops of the slide rails 27 form slide surfaces 27' which extend obliquely downwards and on which the leads 3 slide down on reaching position C, so that the components are given an additional acceleration, and slide into the recess 31 of the respective available receiving means 11' with their component bodies and so the two leads 3 of each component transferred to each receiving means can be moved upwards out of the respective compartment 31', before the following vertical arm of the chain link 29 moves past the path of movement of the outer surfaces of the receiving means 11'.

Apart from the different type of the holding of the components 2 on the receiving means 11', the mode of operation of the turning device 4' corresponds to that of the turning device 4.

I claim:

1. A turning device for electrical axial components, characterized by a transporting element (8), which is mounted on a machine support (9) so as to be rotatable about a first rotation shaft (10) and is driven in a rotating manner about this rotation shaft and supports, at equal intervals from the first rotation shaft (10), a plurality of receiving means (11, 11'), each of which is mounted on the transporting element so as to be freely rotatable about a second rotation shaft (14, 14') and comprises an annular surface (13) extending concentrically to the second rotation shaft (14, 14'), each receiving means (11, 11') forming a receiving surface with holding means for a component (2) and comprising a surface (18) which is adjacent a surface (19) of the transporting element (8); by a first magnet arrangement (17) on each receiving means (11, 11'); by a second magnet arrangement on the transporting element (8) comprised of magnet configurations located adjacent to each receiving means (11, 11'), one of the two magnet arrangements forming—on one of the mutually adjacent surfaces (18, 19)—at least one magnetic pole of a first polarity offset radially with respect to the second rotation shaft (14) and disposed at a radial distance from the second rotation shaft (14, 14') and the other magnet arrangement forming—on the other of the mutually adjacent surfaces (18, 19) and at least approximately at said radial distance from the second rotation shaft (14, 14')—two magnetic poles offset by 180° about the second rotation shaft (14, 14') and having the second polarity which is different from the first one; and by a rolling surface (24) provided on the machine support (9) for rotating the annular surfaces (13) of the receiving means (11, 11') about the second rotation shaft, the rolling surface (24) being movable from a rest position, in which the rolling surface (24) is at a distance from an annular surface (13) moving past, to an operative position, in which the rolling surface (24) bears against an annular surface (13) moving past the said rolling surface (24).

2. A turning device according to claim 1, characterized in that one of the two magnet arrangements forms at least one auxiliary magnetic pole on said other of the mutually adjacent surfaces, (18, 19) which auxiliary magnetic pole is offset by 90° about the second rotation shaft (14, 14') with respect to said two magnetic poles provided on said other of the mutually adjacent surfaces (18, 19) and which auxiliary magnetic pole has the same polarity as the magnetic pole which is provided on said one of the mutually adjacent surfaces.

3. A turning device according to claim 2, characterized in that in the region of the mutually adjacent surfaces (18, 19) each receiving means (11, 11') comprises two magnetic poles offset by 180° with respect to one another and by 90° with respect to the auxiliary magnetic poles about the second rotation shaft (14).

4. A turning device according to claim 3, characterized in that two magnetic poles offset by 180° with respect to one another about the second rotation shaft (14, 14') are provided on the transporting element (8) in the region of the mutually adjacent surfaces.

5. A turning device according to claim 2, characterized in that two auxiliary magnetic poles offset by 180° with respect to one another about the second rotation shaft (14, 14') are provided on the transporting element (8) in the region of the mutually adjacent surfaces (18, 19).

6. A turning device according to claim 5, characterized in that two magnetic poles offset by 180° with respect to one another and by 90° with respect to the auxiliary magnetic poles about the second rotation shaft (14) are provided on the transporting element (8) in the region of the mutually adjacent surfaces (18, 19).

7. A turning device according to claim 6, characterized in that in the region of the mutually adjacent surfaces (18, 19) each receiving means (11, 11') comprises two magnetic poles offset by 180° about the second rotation shaft (14, 14').

8. A turning device according to claim 2, characterized in that the auxiliary magnetic pole, of which there is at least one, is formed by a permanent magnet arranged with one pole in the region of the mutually adjacent surfaces (18, 19).

9. A turning device according to claim 1, characterized in that in the region of the mutually adjacent surfaces (18, 19) each receiving means (11, 11') comprises two magnetic poles offset by 180° about the second rotation shaft (14, 14').

10. A turning device according to claim 1, characterized in that two magnetic poles offset by 180° with respect to one another about the second rotation shaft (14, 14') are provided on the transporting element (8) in the region of the mutually adjacent surfaces (18, 19).

11. A turning device according to claim 1, characterized in that the first magnet arrangement is formed by at least two preferably bar-shaped permanent magnets, which are offset by 180° with respect to one another about the second rotation shaft (14, 14') and each of which extends with one pole into the region of the two mutually adjacent surfaces (18, 19).

12. A turning device according to claim 1, characterized in that the second magnet arrangement is formed by at least two preferably bar-shaped permanent magnets (20), which are offset by 180° with respect to one another about the second rotation shaft (14, 14') on the transporting element (8) in the region of the mutually adjacent surfaces (18, 19).

13. A turning device according to claim 1, characterized in that the second rotation shaft (14, 14') of each receiving means (11, 11') extends radially to the first rotation shaft (10), and the rolling surface (24) is movable in a direction parallel to the first rotation shaft from the rest position into the operative position.

14. A turning device according to claim 1, characterized in that the holding means on the receiving surface of each receiving means (11) are formed by at least one magnetic pole, preferably by at least one magnetic pole of a permanent magnet (17).

15. A turning device according to claim 1, characterized in that the holding means on the receiving surface of each receiving means (11') are formed by a recess (31) connected to an underpressure source.

* * * * *